United States Patent [19]
Daughton et al.

[11] Patent Number: 4,780,848
[45] Date of Patent: Oct. 25, 1988

[54] MAGNETORESISTIVE MEMORY WITH MULTI-LAYER STORAGE CELLS HAVING LAYERS OF LIMITED THICKNESS

[75] Inventors: James M. Daughton, Edina, Minn.; Arthur V. Pohm, Ames, Iowa

[73] Assignee: Honeywell Inc., Minneapolis, Minn.

[21] Appl. No.: 870,068

[22] Filed: Jun. 3, 1986

[51] Int. Cl.[4] ............................................. G11C 11/15
[52] U.S. Cl. .................................... 365/173; 365/158
[58] Field of Search ................. 365/158, 173; 360/113

[56] References Cited

U.S. PATENT DOCUMENTS

| | | |
|---|---|---|
| 3,218,616 | 11/1965 | Huijer et al. |
| 3,432,832 | 3/1969 | Holtwijk |
| 3,493,943 | 2/1970 | Raffel |
| 3,531,780 | 9/1970 | Huijer |
| 3,883,858 | 5/1975 | Lienhard et al. |
| 3,996,575 | 12/1976 | Battarel |
| 4,208,725 | 6/1980 | Paul et al. |
| 4,356,523 | 10/1982 | Yeh |
| 4,455,626 | 6/1984 | Lutes |
| 4,639,806 | 1/1987 | Kira et al. ........................... 324/252 |

FOREIGN PATENT DOCUMENTS 1922552 11/1970 Fed. Rep. of Germany ...... 365/173

OTHER PUBLICATIONS

"Magnetoresistive Readout for 200-Nsec TF Memory," *Electronic Design*, Mar. 15, 1962, p. 31.
"Magnetoresistive Readout of Thin-Film Memories," *Digest of Technical Papers*, 1962 International Solid-State Circuits Conference, P. Huijer, pp. 36-37.
"Magnetoresistance in Laminated NiFe Films," *Journal of Applied Physics*, vol. 53, No. 3, Mar. 1982, van Ooyen, et al., pp. 2596-2598.
"Magnetoresistive Switching of Small Permalloy Sandwich Structure", *Journal of Applied Physics*, vol. 55, No. 2, Jan. 15, 1984, Berchier, et al., pp. 487-492.
IBM Technical Disclosure Bulletin-vol. 12, No. 7, Dec. 1969, p. 1039.

*Primary Examiner*—James W. Moffitt
*Attorney, Agent, or Firm*—W. T. Udseth

[57] ABSTRACT

A digital memory based on a memory cell having two magnetoresistive, ferromagnetic film portions separated by an intermediate layer, all of limited thickness. Each of the magnetoresistive film portions is less than 300 Å thick and the intermediate layer is less than 100 Å thick. Conductive wordlines separated from the upper magnetoresistive film by an insulating layer are utilized, in conjunction with sense current which passes through the cells, to select particular cells for read or write operations.

22 Claims, 2 Drawing Sheets

MAGNETORESISTIVE MEMORY WITH MULTI-LAYER STORAGE CELLS HAVING LAYERS OF LIMITED THICKNESS

BACKGROUND OF THE INVENTION

The present invention relates to ferromagnetic thin film memories, and more particularly, to ferromagnetic thin film memories in which states of the memory cells based on magnetization direction are determined through magnetoresistive properties of the thin film.

Digital memories are used very extensively in computers and coputer system components, in digital signal processing systems, and in other devices based on digital circuits. In those such devices and systems where (i) the memory used must permit access to any bit stored therein randomly (a random access memory or RAM), and (ii) where such access must be accomplished in times on the order of the time taken to change states in such device or system, memories based on storage in electrical circuits in monolithic integrated circuit have become dominant However, such integrated circuit or semiconductor memories still have shortcomings with respect to what is desired in such memories Primarily they are (a) such semiconductor memories lose information upon loss of electrical power, (b) they consume electrical power continually during use, and (c) they are subject to having the information content thereof scrambled in the presence of impinging radiation Such shortcomings can be overcome by the use of memories where bit storage is based on alternative states of magnetization in magnetic materials used in each memory cell, typically thin film materials. However, such magnetic memories have shortcomings of their own. Many ferromagnetic thin film memories used inductive sensing to determine the magnetization state of the magnetic film material used in a cell for storing a bit. This sensing scheme limits the ability to reduce cell sizes sufficiently to make a dense enough memory to be cost competitive with semiconductor memory. This limit is given effect because the signal levels inductively sensed in such magnetic memories declines with reduced thicknesses and widths for the thin film portions used in a cell to store a bit due to there then being less flux linkage to be inductively sensed. The maximum packing density of thin film memory cells providing inductively sensed output signals is not at a density sufficiently high to be competitive in cost with semiconductor memories.

Further, such magnetic memories have usually been formed on a substrate not a part of an integrated circuit. This means there were large numbers of interconnections required between the decoding circuits provided in monolithic integrated circuits and the magnetic memory storage cells leading to difficult technical problems with costly solutions.

An alternative arrangement for sensing states of magnetization in thin film magnetic material portions used in memory cells for storing bits is based on choosing a thin film ferromagnetic material which also exhibits a sufficient magnetoresistance property. Because changes in electrical resistance of such a material with the application, removal or change in magnitude of a magnetic field do not depend to first order on the dimensions of the film portion, the film portion to store a bit can be made very small to thereby improve the packing density of cells in a magnetic memory. Furthermore, such an array of cells containing film portions to store bits can be provided right on a monolithic integrated circuit surface to thereby considerably ease the making of electrical interconnections between the decoding circuits and the memory cells.

However, other problems arise when such ferromagnetic thin films used for each bit are reduced to being very small and packed very closely together on such a surface so as to be very near to one another. The magnetic situation can become much more complex with fields in one film portion serving as a bit storage site affecting neighboring storage cell film portions and vice-versa. Furthermore, a resultant magnetization intended to occur along the easy access of an anisotropic ferromagnetic film can be unstable as to direction and magnitude because of substantial demagnetizing fields occurring in a memory cell thin film portion.

SUMMARY OF THE INVENTION

The present invention provides a digital memory having a bit structure in a memory cell based on an intermediate separating material having two major surfaces on each of which an anisotropic ferromagnetic memory film exhibiting magnetoresistance is provided. This separating material is less than 100 Å thick, and said memory film is less than 300 Å thick. The easy access of magnetization in the film is provided in a selected direction.

DESCRIPTION OF THE PREFERRED EMBODIMENTS

Figure 1:
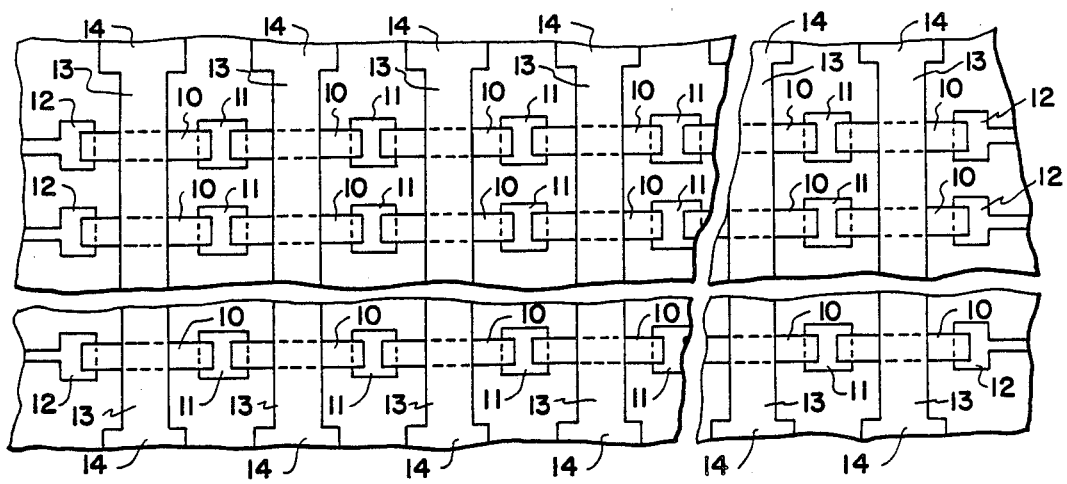
FIG. 1 shows a portion of an array of memory cells of the present invention each containing an anisotropic ferromagnetic thin film portion for storing a bit.

A metallic thin film useful in making magnetic thin film memories is an alloy of nickel, cobalt and iron. Typically, the proportions are chosen to strongly reduce or eliminate any magnetostrictive effects in the film and to improve certain other properties of the film for the application at hand. As a possible example, the film material might comprise approximately sixty percent (60%) nickel, twenty-five percent (25%) cobalt, and fifteen percent (15%) iron. In some situations other materials are added to the alloy in relatively small amounts to improve certain properties of the film.

Such films can be fabricated by vacuum deposition or other methods and, when done in the presence of a magnetic field oriented in a selected direction, the resulting magnetic thin film will exhibit uniaxial anisotropy with the easy axis parallel to the magnetic field orientation. Because very large demagnetizing fields would otherwise result, the magnetization vector of such a film will always lie in the plane of the film.

Furthermore, in accord with thermodynamics, the magnetization in such a fim will arrange itself to minimize the magnetic energy. In the absence of any externally applied magnetic fields such minimization occurs when the magnetization vector of a film portion parallels the easy axis of the film portion pointing in either direction along such axis.

However, the situation in such a film portion changes in the presence of externally applied magnetic fields and the minimization of magnetic energy may then occur with the magnetization vector oriented at an angle with respect to the easy axis. As long as the magnetization of the film portion is in a single domain state, the magnetization vector then can be caused to rotate with respect to the easy axis to angles determined by the externally applied fields, and this can occur without substantially affecting the magnitude of the magnetization.

In such a state with external magnetic fields applied to the film portion, the total magnetic energy can be approximately determined. The minimum of this energy can be calculated as a basis for determining the angle of the magnetization vector with respect to the easy axis, usually as a function of the magnetic field components parallel with and perpendicular to the easy axis.

In addition, the critical values for external magnetic fields can be found governing transitions of the magnetization vector position from unstable to stable states. The equation for such critical fields is found to be in the form of a hypocycloid, usually termed an astroid, so that external fields of values within the astroid leave the magnetization in a stable angle but those of values outside the astroid lead to potential instability. This instability is manifested as a flipping of the magnetization vector from pointing at least to some extent along one direction of the easy axis to pointing to at least some extent in the opposite direction. Thus, the magnetization vector can be made to switch from on direction along the easy axis to the opposite which means the magnetization vector can be in one of two different states which provides the basis for storing a binary bit.

Such ferromagnetic thin film as those just described further exhibit magnetoresistance. Differences in direction between that of the magnetization vector in the thin film and that of current passed through the thin film leads to differences in the effective electrical resistance in the direction of the current. The maximum resistance occurs when the magnetization vector in the film and the current direction are parallel, while the minimum occurs while they are perpendicular. The resistance of a magnetoresistive resistor can be shown to be given by a constant value representing the minimum plus an additional value depending on the angle between the current direction in the film and the magnetization vector therein. This additional resistance follows the square of the cosine of that angle.

Thus, external magnetic fields can be used to vary the angle of the magnetization vector in such a film portion with respect to the easy axis of the film, and can vary it to such an extent as to cause switching of the magnetization vector between two stable states which occur as magnetizations in opposite directions along the easy axis. Further, the state of the magnetization vector in such a film portion can be measured or sensed by the change in resistance encountered by a current directed through this film portion. This provides a basis for a film portion to serve as a bit storage means in a memory cell, the state of which is subject to being determined by effects occurring in currents applied to this portion.

A part of an array of such film portions, 10, is shown in FIG. 1 together forming a digital memory. For now, the film portions 10 can be thought of as being a single layer of film but because of problems in such a memory as indicated above, the structures 10 in practice will be more complex as will be described below. Each of bit structures 10 in a horizontal row is electrically joined to another in that row by interconnection junctures, 11. At opposite ends of each row there is provided end terminating regions, 12. Each row then represents a number of bit structures 10 electrically interconnected in series by junction interconnections 11 between end terminations 12 to thereby form a storage line structure.

FIG. 1 is shown with a vertical break to indicate there may be a very large number of such bit structures in each row, a number much larger than shown. Similarly, FIG. 1 has a horizontal break to show there may be a much larger number of storage lines than has been shown in forming a digital memory.

Also shown in FIG. 1 are a number of word lines, 13, one for each corresponding bit structure 10 in each storage line structure. Each word line 13 is an electrical conductor occurring in series between end terminations, 14. Each word line 13 is formed over portions of a corresponding bit structure 10 in each storage line structure and, although not specifically indicated in FIG. 1, is formed with an insulating layer between word line 13 and adjacent portions of bit structure 10. If such an insulating layer was shown, all lines but lines representing word lines 13 and end terminations 14 would be in dashed form to show them being below the insulating layer.

Also not shown is a further protective and insulating layer formed over the entire structure shown in FIG. 1 Showing such a layer would require all lines in FIG. 1 to be in dashed form to indicate all the structures shown there as being below such a protective layer.

Storage line end terminations 12 permit providing current through each storage line from one of end terminations 12 connected to that line to the other connected at the opposite end thereof. Thus, end terminations 12 are also electrically connected to other circuits such as sensing circuits, write control circuits, decoding circuits, or the like.

Similarly, word line end terminations 14 permit current to be passed through word lines 13 from an end termination 14 at one end thereof to that end termination 14 provided at the other end. Word line end terminations 14 are also connected to other circuits such as current supply circuits, write control circuits, decodin9 circuits, or the like.

Junction interconnections 11, stora9e line end terminations 12, word lines 13, and word line end terminations 14 can all be formed of a convenient conductor material. Since the digital memory portion of FIG. 1 is intended to be provided on a surface portion of a monolithic inte9rated circuit so that circuits in the other portions of the integrated circuit can be conveniently connected to end terminations 12 and 14, a typical conductor material used in integrated circuits would be appropriate. An aluminum layer, perhaps containin9 an additional alloying metal such as copper, on a titanium-tungsten base layer is one example.

Figure 2:
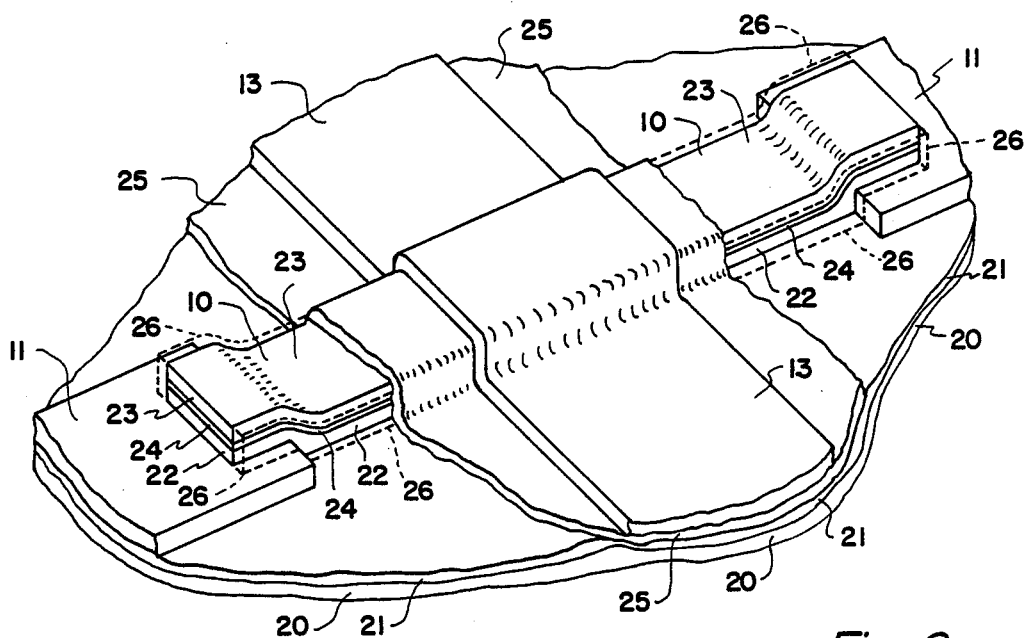
FIG. 2 shows a memory cell in more detail of the kind shown in FIG. 1.

Bit structures 10, however, must be considered in more detail because the structure thereof must overcome those problems indicated above associated with ferromagnetic thin film memories. The first of those problems is the effect of one bit structure on neighboring bit structures, and vice versa, if a single thin film portion is used to provide each such bit structure. As bit structures 10 become more and more compact and located closer and closer to one another, to thereby improve packing density, the interaction of the magnetic fields occurring in one upon its neighbors becomes quite significant. The effect is usually deleterious in that such fields will often act to increase the demagnetizing field experienced in its neighbors. An arrangement to more closely confine the magnetic fields occurring in a bit structure to just that bit structure is shown in FIG. 2. This is a bit structure which would be satisfactory for use as a bit structure 10 in FIG. 1, and accordingly, the designations of structures in FIG. 1 which appear in FIG. 2 are carried over to FIG. 2.

The further structural detail shown in FIG. 2 includes that bit structure 10 is formed over a semiconductor material body, 20, as used in a monolithic integrated circuit, and directly on an insulating layer, 21, supported on a major surface of body 20 in the integrated circuit. Only a small portion of the integrated circuit is shown, and then only a small portion of semiconductor material body 20 is shown of that integrated circuit portion. Juncture interconnections 11 are shown comprising aluminum alloyed with four percent (4%) copper approximately 5000 Å thick, and disposed on the exposed major surface of insulating layer 21.

Also disposed on this exposed major surface of insulating layer 21 is bit structure 10 shown comprised of a lower ferromagnetic thin film, 22, and an upper ferromagnetic thin film, 23. Ferromagnetic thin film layers 22 and 23 are each as described above in that they exhibit uniaxial anisotropy, magnetoresistance, little magnetostriction and are of an alloy composition. In between ferromagnetic thin film layers 22 and 23 is a further thin film layer, 24, which usually would not exhibit ferromagnetism but may be either an electrical conductor or an electrical insulator. Layer 24 must, however, prevent the exchange interaction between electron spins on neighboring atoms from coupling across between layers 22 and 23 to lock together the magnetization vectors in each. A typical choice for layer 24 would be silicon nitride. An insulating layer, 25, covers bit structure 10 although only a part of it is shown in FIG. 2.

The "sandwich" structure of FIG. 2 is effective in reducing magnetic fields outside bit structure 10 because the magnetic fields occurring in either of ferromagnetic thin film layers 22 and 23 are, to a considerable extent, confined to the magnetic path provided by the other. Thus, the effect of magnetic fields occurring in either of layers 22 and 23 on neighboring bit structures is much reduced.

A further confinement of magnetic fields occurring in bit structure 10 of FIG. 2 can be achieved by providing magnetic material on the sides of bit structure 10, as more or less indicated by the dashed lines, 26. These lines are to suggest such magnetic material being used as part of a single anular ferromagnetic thin film arrangement comprising also layers 22 and 23, or which may be provided separately from layers 22 and 23. Such an addition of magnetic side material to bit structure 10 would improve the confinement of magnetic fields in bit structure 10. On the other hand, the addition of such side magnetic structures 26 means additional fabrication process effort, complexity, and cost. No indication has been made in FIG. 2 for the greater room required under insulating layer 25 to accommodate the side magnetic material 26 although, obviously, layer 25 would have to cover such side magnetic material also.

Finally, word line 13 is shown in FIG. 2 disposed on the major surface of insulating layer 25. Word line 13 is typically comprised of an aluminum layer alloyed with approximately four percent (4%) copper on a titanium-tungsten base layer in a total thickness of 5000 ÅÅ protective and insulating layer over the entire structure of FIG. 2 would be used in practice but is not shown.

The orthogonality of word line 13 and bit structure 10, the magnetoresistive properties of layers 22 and 23, and the desire to have as large an output signal as possible leads to a choice of providing the easy axis in layers 22 and 23 in one of two principle directions. Bit structure 10 can be operated in a longitudinal mode with the easy axis for layers 22 and 23 directed parallel to bit structure 10 between juncture interconnections 11. Alternatively, the easy axis in layers 22 and 23 can be formed perpendicular to this first choice and parallel to word line 13 leading to operation in the transverse mode. A possible operating scheme with non-destructive readout of the bit state in a bit structure 10 can be sketched for each operating mode.

For the longitudinal operating mode, the easy axis and ferromagnetic thin film layers 22 and 23 extends between the juncture interconnections 11 with the anisotropy magnetic field, $H_K$, and the magnetization, M, both directed therealong in the absence of any externally applied magnetic fields. Information, or the state of the digital bit stored in bit structure 10, is stored in layers 22 and 23 in the absence of external magnetic fields by having the vector for magnetization M pointed in one direction between interconnections 11 or in the other direction.

If the magnetization direction is caused to rotate from a direction along the easy axis by external magnetic fields, the electrical resistance of layers 22 and 23 changes with this magnetization direction rotation because of the magnetoresistive properties thereof. For the kinds of materials in layers 22 and 23, the maximum change in resistance is on the order of a few percent of the minimum resistance value.

To read the state of a bit structure 10, currents are passed through the storage line of FIG. 1 in which the bit structure occurs and through that word line 13 passing over such bit structure. The sense line current magnitude is set so that the magnetic field generated by such current rotates the magnetization direction in layers 22 and 23 to a significant angle from the easy axis. If current through the word line is now provided, the magnetic field associated with that current will for one state of the magnetization of layers 22 and 23 increase the angle of rotation, and for the other state decrease the angle of rotation.

Such changes in the angle of magnetization direction by these rotations cause different changes in the electrical resistance of layers 23 and 24 because of the magnetoresistive properties of these layers. The bit state which leads to an increase in the angle of rotation of the magnetization vector with the application of the word current will lead to a lower resistance if that is the state taken in bit structure 10, while the opposite state will lead to an increase resistance. Such changes in resistance will affect the sense current on the sense line which effects can be detected to determine the state of the corresponding bit structure. Both the sense current and the word current must be kept small enough so that the magnetic fields generated thereby do not exceed the critical fields described by the astroid plot for the bit structure under consideration. Otherwise, switching the magnetization vector from one state to the other may occur.

Just the opposite requirement for magnitudes of the bit and sense currents occur when a desired state of the bit structure is to be written into that structure. The sense and word currents are set to be insufficient individually to cause switching of the magnetization vector, but cumulatively to be enough for such switching. The state set is determined by the direction of current flow through the word line.

A similar scheme can be used for operating in the transverse mode with the easy axis in films 22 and 23 perpendicular to the easy axis direction in the longitudinal mode, i.e. parallel to word line 13. The magnetization vector then points in one direction or the other along this easy axis to determine the state of bit structure 10. Current is supplied along the word line sufficient to cause a magnetic field which rotates the magnetization vector to an angle from the easy axis. Current supplied along the sense line will then cause the rotation to increase when the bit structure is in one state and decrease when it is in the opposite state leading to a detectable difference in the electrical resistance in layers 23 and 24 because of the magnetoresistive effect. Again for non-destructive readout, these currents must be small enough tht the magnetic fields generated thereby cannot exceed the critical field level determined by the astroid for bit structure 10. Again, for setting the state for the bit structure, larger currents are applied along the sense and bit lines with the direction of the current on the sense line determining the state occurring in the bit structure.

To achieve either of the foregoing operations, however, bit structures 10 must be carefully constructed. Small ferromagnetic thin film portions are subject to very high demagnetizing fields because the effective "free poles" are closer together along the edges of the film leading to larger demagnetizing fields. This can be seen since the widths of bit structure 10 in the direction of word line 13 will be on the order of 0.1 micron to, at most, a few microns. Such dimensions are necessary to meet the high density requirement for such bit structures to keep costs low on a cost per cell basis, and because small currents in the sense or word lines allow faster switching. Such currents can be kept small only if the thin film portions are also small.

A ferromagnetic thin film portion typical of the kind being considered here, that is, 1000 Å thick and in the form of a square 2 microns on a side, can be approximated by an inscribed elipsoid for purposes of calculating its demagnetization field. Assuming that the thin film square has a saturation magnetization value of $M_S$, a thickness of T, and a major axis of length 2r, the following equation applies for the demagnetization field $H_D$ in the corresponding inscribed elipsoid:

$$H_D = \frac{\pi}{4} \frac{TM_s}{r}.$$

If the saturation magnetization is around 10,000 Gauss, the uniform demagnetizing field will be on the order of 785 Oersteds, a field strength which is two orders of magnitude larger than typical anisotropy field strengths $H_K$ in such ferromagnetic thin films. These demagnetizing fields would undoubtedly dominate the behavior of such a film portion and result in instability in the magnetization of such a film in the sense that the magnetization would be forced from lying entirely along the easy axis to lying at least in part in some other direction even in the absence of external fields.

Again, the "sandwich" arrangement for the bit structure in FIG. 2 provides aid in this situation because the demagnetizing fields in each of films 22 and 23 act to cancel one another. Nevertheless, very large uncancelled fields will still occur because of the drop in field strength with distance given the separation between films 22 and 23. Even if a large fraction of the magnetizing fields are cancelled, the remaining uncancelled portions of two rather large demagnetizing fields can still be on the order of anisotropy field strengths $H_K$ leading to the kinds of instabilities in the magnetization of the devices as indicated above.

Figure 3A:
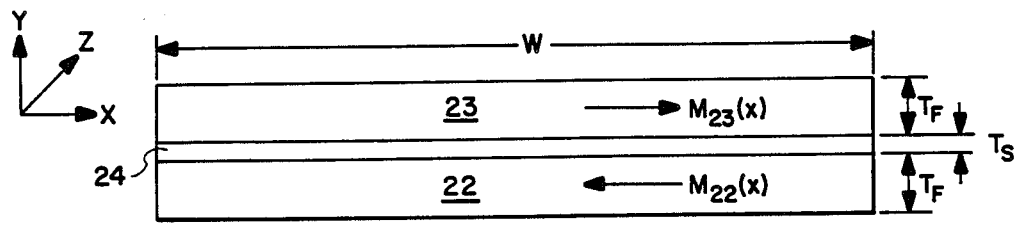
FIG. 3 shows a diagrammatic cross section of the bit structure shown in FIG. 2, set out in FIG. 3A, and a graph of magnetization along an axis, as set out in FIG. 3B.

Consider in FIG. 3 a diagrammatic cross section of bit structure 10 of FIG. 2 parallel to word line 13 where the cross section view in FIG. 3A shows ferromagnetic thin films 22 and 23 and separating film 24. This cross section is taken relatively far from either of juncture interconnections 11. Insulating layers, protective layers, semiconductor material body substrate and the like are ignored and therefore omitted from the cross section of FIG. 3. Each of ferromagnetic thin films 22 and 23 are shown in FIG. 3 to have a thickness designated $T_F$ while the separating film 24 which is free of any ferromagnetic properties is shown to have a thickness $T_S$. The transverse operating mode has been chosen here, so that the easy axis in each film is parallel to word line 13. The magnetization shown for each film, $M_{22}(x)$ and $M_{23}(x)$, are both shown as a function of x for reasons to be described, and are shown in opposite directions along the x axis which is an arrangement that minimizes the magnetic energy.

Near the edges of films 22 and 23, anisotropy fields are dominated by the demagnetizing fields due to the "free poles" at the edges. If the magnetizations of films 22 and 23 were saturated, the demagnetizing fields would approach $M_S/2$ in the films or about 5,000 Oersteds for films with the alloys described here. Typical films of these alloys will have a coercitivity and an anisotropy field in the order of only 20 Oersteds, leading to instabilities in the magnetization at the edges of these films.

In such large demagnetizing fields, electron spins at the edge of the strip are constrained to lie nearly parallel to the long dimension of these films, i.e. along the z axis. The direction of these electron spins only gradually turn to pointing across the films further inward toward the center of the films where the demagnetizing fields are no longer overcoming the anisotropy field. The rate, shape and distance of occurrence are all a complex function depending on magnetostatics of the situation, the quantum exchange interaction between adjacent atom electron spins, and anisotropy considerations not unlike those leading to Neel walls.

Figure 3B:
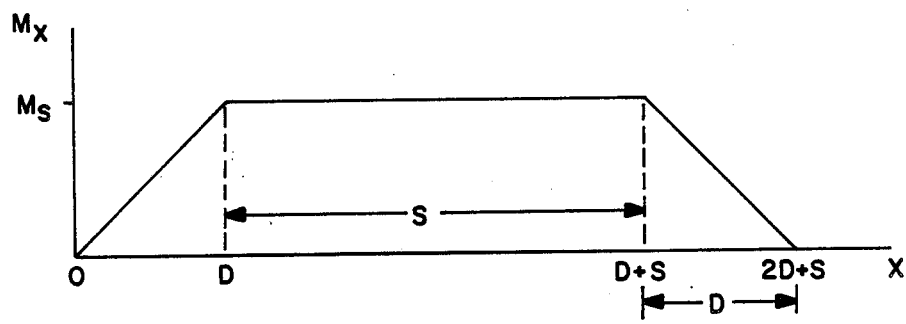

This is reflected in the simplified graph in FIG. 3B below the films shown in FIG. 3A where the magnetization along the x axis is shown to be at zero at the outer edges of the films and gradually increasing towards the interior of the films to the saturation value $M_S$ occurring in the central portions of the films for interior film width distance S. In the regions of width D between the exterior edges of the film and the point where magnetic saturation begins, the magnetizations are in transition from pointing along the z axis to along the x axis.

Detailed analysis has shown that for films of the kind being considered here having a film thickness of 150 Å ($T_F$) separated by 50 Å ($T_S$) leading to an anisotropy field $H_K$ of 25 Oersteds, that distance D is about 0.4 microns in a 2 micron wide film. A film only 1 micron wide, would saturate for only about 0.2 microns in the central regions of the film, and therefore the x directions magnetization would be only marginally stable.

Therefore, films with easy directions on the transverse axis do not truly saturate across the films. Further, films that are thicker or having greater separation therebetween, or both, are found to have even less of the central interior regions of the strip in magnetic saturation along the x axis leading to even less stability.

The uncancelled field in one film, that is, the magnetic field in one of films 22 and 23 due to the demagnetization fields in each of these films can be found from again using inscribed elipsoids in the x-y plane of the cross sections of films 22 and 23 in FIG. 3 as a basis for such a determination. The uncancelled field in the chosen film can be found by finding the field at the midpoint of such a film because the average effect of field in the film can be approximated as the field occurring at such midpoint. This estimate of the average effect of field through the film is reasonable because the exchange interactions between the electron spins of adjacent atoms in the film are so strong through the thickness of a very thin ferromagnetic film that the spins of electrons on such adjacent atoms throughout this thickness are constrained to align within a few degrees of one another.

These inscribed elipsoids have their major axes along the width of films 22 and 23 of a length equal to w or 2r. The magnetizations of the films are saturated inside these elipsoids. The center of one film is separated from the other by the distance $T_F + T_S$.

The uncancelled field in one film, Huncan, can be written:

$$H_{uncan} H_D g((T_f + T_s)/r),$$

where $H_D$ is the demagnetizing field occurring within one of the elipsoids in one of the films due to just the surface poles of that film, and g, as a function of the argument $(T_f + T_S)/r$, is a cancellation factor arising because of the action of the demagnetizing field of the other film opposing the demagnetizing field of the first film. In the situation where $T_f + T_S$ is much less than r, the uncancelled field has been found to satisfy the approximation:

$$H_{uncan} = H_D g((T_f + T_s)/r)$$
$$\cong H_D \left[ 2.4 \left( \frac{T_f + T_s}{r} \right) \right].$$

Experiment has confirmed the accuracy of this approximation.

The value of the anisotropy magnetic field $H_K$ in ferromagnetic thin films of the nature being considered here is typically 10 to 30 Oersteds determined primarily by the chemical composition of the film but also depending on various other parameters such as angle and deposition of the film on the substrate, the substrate temperature, anisotropic strains resulting in the film, and the like. In any event, to keep the demagnetization fields in a film portion from dominating the anisotropy field too great an extent, the uncancelled portions of the demagnetizing fields in the film should be kept in the range from 2 to 6 Oersteds. That is, the ratio of Huncan to $H_K$ is a measure of the stability of the magnetization. The ratio is unacceptable with a value of 1 and one can be quite confident of a value of 10 so an intermediate ratio value such as 5 is a reasonable choice.

To determine then the permitted thicknesses for the films in the bit structure 10 of FIG. 2, the first equation above and the last equation above can be combined and a choice for the uncancelled magnetic fields of 3 Oersteds or less leads to the following in equality:

$$\left( \frac{\pi}{4} \frac{T_f M_s}{r} \right) \left[ 2.4 \left( \frac{T_f + T_s}{r} \right) \right] \leq 3.$$

If w in FIG. 3 is taken to be 2 microns, and the saturation magnetization in films 22 and 23 is again taken to be 10,000 Gauss, this inequality can be rewritten as follows:

$$T_f(T_f + T_s) \leq 16,000.$$

This last inequality is sufficient for just the conditions assumed insofar as a desirable width for bit structure 10, and the material composition leading to the magnetization saturation used in reaching this inequality. Further, the 3 Oersted limit on acceptable uncancelled demagnetization fields is somewhat arbitrary. In other design situations, then, another inequality would be used.

Nevertheless, values of permitted thin film thicknesses allowing stable magnetizations in films 22 and 23 in this design situation are of significance in illustrating the acceptable ranges of values. They can be obtained from this last inequality on assuming one of the thickness values. If the thickness of separating film 24 is chosen to have a thickness of 50 Å, then the ferromagnetic films 22 and 23 must be less than about 105 Å in thickness.

This thickness choice for separating film 24 is not an unreasonable choice in that the film needs only to be thick enough to break the exchange interaction coupling between electron spins in atoms at the edges of each of ferromagnetic film layers 22 and 23. Typically, a separation on the order of 10 angstroms is sufficient to eliminate such exchange coupling between layers 22 and 23. The material for layer 24 has been chosen to be an insulating film, silicon nitride, which gives good fabrication process results. The choice of a conductor, although partially shorting the magnetoresistive response signal, still has the advantage of shorting layers 22 and 23 together so that the sense current flowing in these layers is distributed more uniformly therebetween, particularly if there is a defect in one of the other layer along the current paths. A further alternative, the material in layer 24 could in some situations be either a ferromagnetic material or a ferrimagnetic material if there is sufficient exchange interaction mismatch with layers 22 and 23 to prevent the exchange interaction from coupling therebetween. With this latter choice of materials, the possible use of an outer magnetic material covering on the sides 26 could be eliminated as flux closure could be provided by this chosen material for layer 24.

Thus, the thickness chosen for intermediate layer 24 is a reasonable one and leads to rather thin ferromagnetic films for layers 22 and 23 in this design example. In practice over the range of acceptable designs to give sufficient bit structure density and operating rapidity for a digital memory, the thickness of films 22 and 23 should be less than 300 Å, and preferably less than 200

Å. The thickness in these situations of intermediate layer 24 should be less than 100 Å.

Restricting the thickness of ferromagnetic films 22 and 23 sufficiently to achieve a relatively low uncancelled demagnetizing field in each is a good design practice because there may be further demagnetization fields arising in a practical design not accounted for in the foregoing analysis. For instance, there will be some demagnetizing fields occuring along the z axis in films 22 and 23 which would also be reduced by a restricted film thickness. Further, while films 22 and 23 have been shown to be of comparable thickness and width, this may not necessarily be the best design in each situation. Further, a different alloy material for each of films 22 and 23 may be desirable in some design situations. These sorts of differences may lead to additional demagnetizing field strengths which also would be reduced by limiting the thickness of such films.

Bit structure 10 can very readily be provided in a monolithic integrated circuit chip. Because bit structure 10 is formed on insulating layer 21 and would have only insulating protective layers thereover, and because none of these layers are magnetically permeable, bit structure 10 can be designed without reference to the integrated circuit structure environment. Further, the interconnections between the digital memory and the remaining portions of the integrated circuits can be provided by the normal integrated circuit fabrication process steps for providing interconnections.

Only the memory cell array construction steps need to be added to the normal steps used for fabricating monolithic integrated circuits. In some circumstances, the additional steps needed to construct the memory array can be integrated with already existing monolithic integrated circuit fabrication process steps to minimize or possibly eliminate additional fabrication steps in providing the digital memory on a monolithic integrated circuit chip.

The embodiments of the invention in which an exclusive property or right is claimed are defined as follows:

1. A magnetoresistive sensing, ferromagnetic thin film based digital memory, said memory comprising: a first storage line structure having a first storage line pair of end terminals adapted to conduct electrical current in at least one direction, said storage line end terminals having electrically connected in series therebetween a plurality of bit structures with each said bit structure electrically connected at a bit juncture to at least one other said bit structure, each said bit structure to comprise at least a structure comprising:
   an intermediate layer, said intermediate layer having two major surfaces on opposite sides thereof such that said major surfaces are separated by less than one hundred Angstroms but sufficiently separated for said intermediate layer to prevent any exchange interaction from coupling thereacross, and
   a memory film on each of said intermediate layer major surfaces with said memory film being of a thickness less than three hundred Angstroms and of a magnetoresistive, anisotropic ferromagnetic material, and
   a plurality of word line structures each having a pair of word line end terminals adapted to conduct electrical current in at least one direction, each said pair of said word line end terminals having an electrical conductor electrically connected therebetween which is located across an electrical insulating layer from said memory film on one of said major surfaces of said intermediate layer of a selected one of said bit structures.

2. The apparatus of claim 1 wherein said memory film on said major surfaces of said intermediate layer of each of said bit structures is of a thickness less than two hundred Angstroms.

3. The apparatus of claim 1 wherein an easy axis of magnetization of said memory film in at least one of said bit structures substantially parallels a center line of said intermediate layer where said center line has an end point at each said bit juncture.

4. The apparatus of claim 1 wherein an easy access of magnetization of said memory film in at least one of said bit structures is substantially perpendicular to a center line of said intermediate layer where said center line has an end point at each said bit juncture.

5. The apparatus of claim 1 wherein said memory film on each of said major surfaces of said intermediate layer of at least one of said bit structures is arranged such that there are two separate films with one of said separate films on each of said major surfaces.

6. The apparatus of claim 1 wherein said memory film on each of said major surfaces of said intermediate layer of at least one of said bit structures is arranged such that ferromagnetic material substantially surrounds said intermediate layer at least where said bit structure is free of a said bit juncture.

7. The apparatus of claim 3 wherein said memory film on each of said major surfaces of said intermediate layer of at least one of said bit structures is arranged such that there are two separate films with one of said separate films on each of said major surfaces.

8. The apparatus of claim 3 wherein said memory film on each of said major surfaces of said intermediate layer of at least one of said bit structures is arranged such that ferromagnetic material substantially surrounds said intermediate layer at least where said bit structure is free of a said bit juncture.

9. The apparatus of claim 4 wherein said memory film on each of said major surfaces of said intermediate layer of at least one of said bit structures is arranged such that there are two separate films with one of said separate films on each of said major surfaces.

10. The apparatus of claim 4 wherein said memory film on each of said major surfaces of said intermediate layer of at least one of said bit structures is arranged such that ferromagnetic material substantially surrouhds said ihtermediate layer at least where said bit structure is free of a said bit juncture.

11. The apparatus of claim 5 wherein said memory film on said major surfaces of said intermediate layer of each of said bit structures is of a thickness less than two hundred Angstroms.

12. The apparatus of claim 5 wherein a second storage line structure is provided substantially matching said first bit line structure including that structural relationship with said plurality of word line structures.

13. The apparatus of claim 6 wherein said memory film on said major surfaces of said intermediate layer of each of said bit structures is of a thickness less than two hundred Angstroms.

14. The apparatus of claim 6 wherein a second storage line structure is provided substantially matching said first bit line structure including that structural relationship with said plurality of word line structures.

15. The apparatus of claim 7 wherein said memory film on said major surfaces of said intermediate layer of each of said bit structures is of a thickness less than two hundred Angstroms.

16. The apparatus of claim 7 wherein a second storage line structure is provided substantially matching said first bit line structure including that structural relationship with said plurality of word line structures.

17. The apparatus of claim 8 wherein said memory film on said major surfaces of said intermediate layer of each of said bit structures is of a thickness less than two hundred Angstroms.

18. The apparatus of claim 8 wherein a second storage line structure is provided substantially matching said first bit line structure including that structural relationship with said plurality of word line structures.

19. The apparatus of claim 9 wherein said memory film on said major surfaces of said intermediate layer of each of said bit structures is of a thickness less than two hundred Angstroms.

20. The apparatus of claim 9 wherein a second storage line structure is provided substantially matching said first bit line structure including that structural relationship with said plurality of word line structures.

21. The apparatus of claim 10 wherein said memory film on said major surfaces of said intermediate layer of each of said bit structures is of a thickness less than two hundred Angstroms.

22. The apparatus of claim 10 wherein a second storage line structure is provided substantially matching said first bit line structure including that structural relationship with said plurality of word line structures.

* * * * *

UNITED STATES PATENT AND TRADEMARK OFFICE
CERTIFICATE OF CORRECTION

PATENT NO. : 4,780,848

DATED : October 25, 1988

INVENTOR(S) : DAUGHTON ET AL

It is certified that error appears in the above-identified patent and that said Letters Patent is hereby corrected as shown below:

Column 12, line 49, cancel "rouhds said ihtermediate" and substitute --rounds said intermediate--

Signed and Sealed this

Eleventh Day of April, 1989

Attest:

DONALD J. QUIGG

*Attesting Officer*

*Commissioner of Patents and Trademarks*